MOS PROCESS AND STRUCTURE

INVENTORS
WILLIAM A. BROWN
WALTER F. KROLIKOWSKI
ROGER F. MAUDE
JAMES L. REUTER
JAGTAR S. SANDHU
BY Harry M Weiss
ATTORNEY

BIPOLAR PROCESS AND STRUCTURE

United States Patent Office 3,756,876

Patented Sept. 4, 1973

3,756,876

FABRICATION PROCESS FOR FIELD EFFECT AND BIPOLAR TRANSISTOR DEVICES

William A. Brown, Wappingers Falls, and Walter F. Krolikowski, Hopewell Junction, N.Y., Roger F. Maude, Trumbull, Conn., and James L. Reuter and Jagtar S. Sandhu, Fishkill, N.Y., assignors to Cogar Corporation, Wappingers Falls, N.Y.

Filed Oct. 27, 1970, Ser. No. 84,262

Int. Cl. H01l 7/50

U.S. Cl. 156—17 18 Claims

ABSTRACT OF THE DISCLOSURE

A fabrication process for manufacturing field effect (FET) or bipolar transistor devices is disclosed. In making an FET device, the gate window and the source and drain contact holes are opened up simultaneously after the source and drain diffusion operation. This simultaneous oxide etching operation for both FET and bipolar devices is achieved after the prior formation of an optimum differential oxide thickness or in the surface of the semiconductor substrate. In making a bipolar device, the emitter, base and collector contact holes are opened up simultaneously without any over or under etching of any of the holes.

BACKGROUND OF THE INVENTION

Field of the invention

This invention relates generally to a process for manufacturing semiconductor devices and, more particularly, to a process for manufacturing field effect or bipolar transistor structures without over or under etching all holes in the oxide surface layer.

DESCRIPTION OF THE PRIOR ART

In the past, a number of different processing techniques were devised to manufacture bipolar and/or field effect transistor devices. One technique that was used in fabricatfield effect transistors of the insulated gate type was, as described and shown in the co-pending patent application entitled "Technique for Fabrication of Semiconductor Device," inventors Vir A. Dhaka, et al., filed Aug. 29, 1969, Ser. No. 854,196, now U.S. Pat. No. 3,634,204 and assigned to the same assignee of the present invention, to form the insulating gate layer prior to the formation of the source and drain regions.

Another technique in the fabrication of a field effect transistor device was to form the gate insulating region after the formation of source and drain regions. An example of this latter type is described and shown in the co-pending patent application entitled "Semiconductor Device and Fabrication Method Therefor," inventors James L. Reuter et al., filed May 19, 1969, Ser. No. 825,863, now U.S. Pat. No. 3,627,647 and assigned to the same assignee of this invention.

In this latter example, the original oxide over the gate region was first completely removed, a thin oxide layer was then grown or deposited on the silicon surface and a gate electrode was then formed on the thin insulating layer. The gate electrode was formed after holes had been etched out for the formation of contacts to the source and drain regions. Consequently, the source and drain contact holes were etched out after the etching out and formation of the gate oxide layer.

A disadvantage associated with some prior art FET processes is that the doping concentration and/or thickness of the glass oxide or surface insulating layer were usually too variable across the surface of the semiconductor substrate. Consequently, it was impossible to etch or open up a number of predetermined areas in the oxide without some over-etching (causing undercutting) or under-etching.

The problem of undercutting (or over-etching) during the process of forming openings in the oxide layer is very serious in device manufacture since it means that etching takes place in the region surrounding or adjacent the area that is to be etched away so that a greater amount of etching takes place laterally along the surface of the semiconductor or silicon material than is desired. This affects overall product yield since the deposited metal in the contact hole can extend laterally across the semiconductor surface beyond the predefined contact region thereby possibly shorting out the device (by contacting another diffused region) and making the associated circuit inoperative. The problem of under-etching is created by the failure of the etchant to etch completely through the oxide region, thereby leaving a residual amount or layer of glass or oxide material over the semiconductor surface which prevents making good electrical contact to the semiconductor surface. Both the over-etching and under-etching problems described above are taken into consideration by the semiconductor manufacturer and an attempt is made to set precise etching times and conditions to avoid either problem, but with the recognition that a balance has to be made to allow some over-etching in certain areas to prevent under-etching in other areas. This balance is very difficult to achieve especially when consideration has to be made of (a) different oxide thicknesses across the substrate surface and (b) different oxide doping concentrations at various regions across the substrate surface which create undesired etching conditions. Precise alignment control is very critical to an extreme degree in the formation of MOS or field effect type devices. For example, the FET device speed of operation is directly related to the spacing or channel distance between the source and drain regions. Hence, the speed of the FET device is directly related to the size and geometry of the gate area. Misalignment of the source and drain regions with respect to the gate region results in either the formation of inoperative devices or circuits or an inconsistent performance results due to a loss or gain in the speed or operation of the field effect transistor device.

In fabricating bipolar devices such as NPN transistors, the same problems of over-etching and under-etching of contact holes to the emitter, base and collector regions of the device had to be overcome in order to maximize device yield. Especially, in the conventional case of making an NPN transistor device with a phosphorous doped emitter region derived from a phosphorous doped oxide layer, the same problem existed of preventing both the over-etching of the emitter contact hole formed in the heavily doped, easily etched phosphorous oxide layer over the emitter region and the under-etching of the base contact hole formed in the relatively harder to etch oxide layer located over the base region of the transistor device.

Accordingly, it was desirable to develop a technique or process for simultaneously forming contact holes in a bipolar device and both gate and contact openings in a field effect transistor device so that minimization of contact hole etching after gate oxide formation takes place.

SUMMARY OF THE INVENTION

Accordingly, it is an object of this invention to provide an improved process for fabricating bipolar and/or field effect transistor devices.

It is another object of this invention to provide an improved process for fabricating a field effect transistor device of the insulated gate type.

It is still another object of this invention to provide an improved process for fabricating bipolar and/or field effect transistor devices having different oxide thicknesses and different impurity or doped oxide regions across the surface of the semiconductor substrate.

It is a still further object of this invention to provide a process for simultaneously opening contact holes in bipolar devices.

It is another object of this invention to provide a process for simultaneously opening source and drain contact holes (with a minimization of etching thereafter) and the gate oxide window of an FET device.

DESCRIPTION OF THE PREFERRED EMBODIMENTS

In accordance with one embodiment of this invention, a process is disclosed for fabricating a field effect transistor device. The gate window together with the openings for contact to the source and drain regions are simultaneously formed in one etching operation. Subsequently, the thin oxide gate region is formed and the thin oxide region in the source and drainholes formed during the formation of the thin oxide gate region is etched away prior to formation of contacts to the source and drain regions of the FET device.

In accordance with another embodiment of this invention, a process for fabricating a bipolar device is described which includes the formation of semiconductor regions of opposite type conductivity in a semiconductor substrate. An oxide layer is formed or deposited on a surface of the semiconductor substrate and openings are simultaneously etched completely through oxide regions of the oxide layer located over the semiconductor regions of opposite type conductivity. In fabricating an NPN transistor, contact holes to the emitter, base and collector regions of the device are simultaneously formed and etched completely through to the semiconductor substrate surface.

The foregoing and other objects, features and advantages of the invention will be apparent from the following, more particular description of the preferred embodiments of the invention, as illustrated in the accompanying drawings.

THE SPECIFICATION

Figure 1:
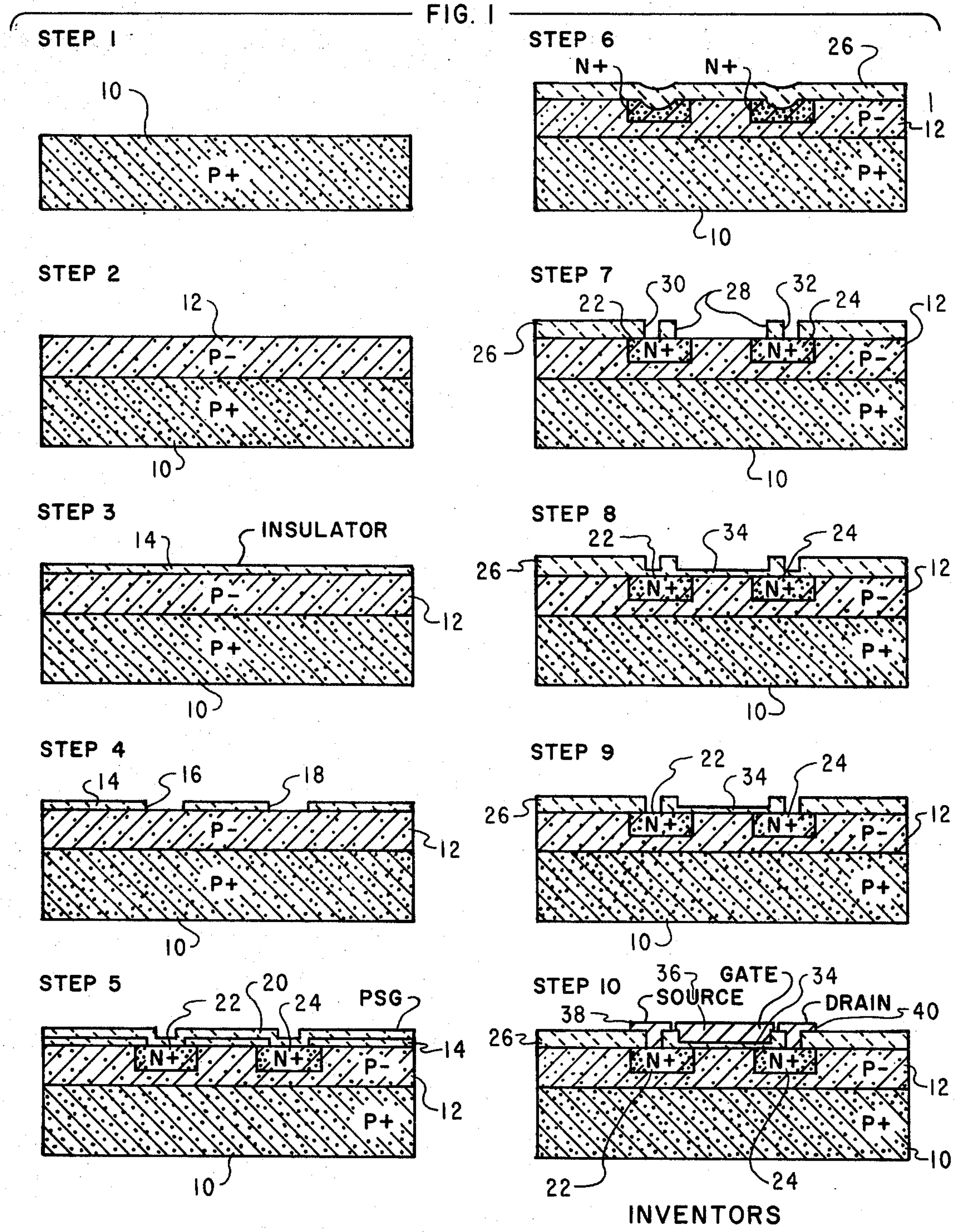
FIG. 1 is a flow diagram, in cross-section, depicting the steps in the process for fabricating a field effect transistor device in accordance with this invention.

Referring to FIG. 1, step 1 of the field effect transistor device fabrication process of this invention depicts a P+ type substrate 10 which has a resistivity of, for example, about .05 to .2 ohm-centimeter and has a thickness of about 15 mils. Although, for the purpose of describing this invention, reference is made to a semiconductor structure where a P+ type substrate is utilized as the starting substrate and subsequent semiconductor regions of the opposite type conductivity are formed in the starting substrate, it is readily apparent that all the semiconductor regions referred to as being of one conductivity type can be of the opposite conductivity type, including the starting substrate, and furthermore, some of the semiconductor regions formed by diffusion operations can also be made by epitaxial growth techniques. Similarly, some of the epitaxial growth regions can also be fabricated by conventional diffusion techniques. The substrate 10 is a wafer of, preferably, monocrystalline silicon material which can be fabricated by a conventional technique such as by pulling a silicon semiconductor rod from a melt containing the desired P-type impurity concentration and then slicing the pulled rod which has an elongated bar shape configuration into a plurality of wafers. The wafers are then cut to size, lapped and chemically polished. The wafers have any desired crystallographic configuration, but are preferably slightly off the (100) axis in any direction. The P+ substrate 10 has a very low electrical resistance and hence, serves as a good conductor of the current which the P-type substrate receives during switching of the FET devices. Therefore, an external contact (not shown) connected electrically to the P-type substrate can rapidly draw current from the substrate due to the high conductivity of the P+ substrate 10.

In step 2 of the process, a very thin epitaxial layer 12 is deposited or grown on the substrate 10. The epitaxial layer 12 is of P-type conductivity and preferably has a resistivity of about 2 ohm-centimeters and a thickness of about 4 microns. This thin epitaxial layer 12 subsequently serves as the P-type substrate for the formation therein of the N-channel FET devices. The use of an epitaxial layer is advantageous because it permits a high degree of control to be achieved on the resistivity of the substrate layer that is to contain the diffused source and drain regions forming the FET devices. Some semiconductor manufacturers form their N source and drain regions in the starting substrate which is of high resistivity P— material. It is difficult to consistently obtain all starting substrates, pulled and formed from a melt, with the desired resistivity.

The thin epitaxial layer 12 also provides the advantage of permitting current passing into the P— epitaxial layer 12 in the switching of the FET device to be rapidly passed into the high conductivity P+ substrate 10 because of the thinness of the epitaxial layer 12. Furthermore, in providing an N+ protective diffused region associated with terminal pads as shown and described in the co-pending patent application entitled "FET Memory Chip Including FET Devices Therefor and Fabrication Method," filed concurrently with this application Ser. No. 84,277, inventors Krolikowski et al., now pending and assigned to the same assignee, high voltage pulses applied to the terminal pads will not break down the thin oxide gate regions electrically connected to the terminal pads because the thin epitaxial layer 12 will enable junction breakdown to occur beneath the N+ protective diffused regions before a high voltage can be applied to any of the gate regions. Hence, breakdown currents from the protective diffused regions associated with the pads can be passed rapidly through the thin epitaxial layer 12 into the P+ substrate 10.

In step 3, an insulating oxide layer 14 is preferably formed on the surface of the epitaxial layer 12 by thermal oxide growth techniques. However, other deposition techniques can be used such as pyrolitic oxide formation, evaporation or RF sputtering of oxide material. The initial silicon dioxide layer 14 has a thickness of about 6,000 A. If desired, other insulating materials than silicon dioxide can be utilized such as, for example, silicon nitride, aluminum nitride, aluminum oxide, etc.

In step 4, using conventional photolithographic masking and etching techniques, openings 16 and 18 are formed in the oxide layer 14. If desired, sputter etching techniques can be utilized to form the openings 16 and 18 by using a mask and a reverse sputtering procedure.

In step 5, a phosphosilicate glass (PSG) layer 20 is deposited over the oxide layer 14 for the formation of N+ source and drain regions 22 and 24, respectively, by diffusion techniques through openings 16 and 18 in the masking oxide layer 14. The sheet resistance of the source and drain regions at this state of the process of fabricating the FET device is about 10–12 ohms per square and the $X_j$ or distance of the N+ diffused regions into the P-type epitaxial substrate region 12 is on the order of about $0.75\mu$. The phosphosilicate glass layer 20 has a thickness of about 1500 A. in the regions in contact with the silicon in the openings in the oxide layer 14.

In step 6, surface oxide layer 26 is shown to be substantially uniform over the entire substrate surface except for the recessed oxide regions over the source 22 and drain 24 diffused regions. These oxide recessed regions are achieved during a reoxidation step after the PSG deposition operation in step 5 which is carried out at a temperature of about 900° C. The reoxidation step is carried out at 900° C. at time periods of 10 minutes in a dry oxygen atmosphere followed by 120 minutes in a steam oxidation atmosphere followed by 5 minutes in a dry oxygen atmosphere. During the reoxidation operation, a portion of the diffused N+ layer is converted into silicon dioxide as shown in the drawing of step 6. Accordingly, the recessed oxide regions over the source 22 and drain 24 diffused regions are often thicker than the non-recessed oxide regions. This reoxidation step serves to develop a thickness of combined oxide and phosphosilicate glass over the source and drain regions that is at least the same and preferably higher than the thickness of the oxide over the remaining (P) regions of the semiconductor substrate. In some cases, it may be desirable to continue oxide growth for a period of time sufficient to create an oxide bump region rather than a recessed region. During reoxidation, the diffused N+ regions penetrate to a depth ($X_j$) of about 1 micron. There is an approximately 500 A. difference between the thickness of the oxide (about 8000 A.) over the source and drain regions which is greater than the thickness of the oxide (about 7500 A.) over the remainder of the semiconductor substrate surface. The reoxidation step can have varying times and temperatures provided the thickness of the oxide regions over the source and drain diffusion regions is formed to an optimum level to permit simultaneous etching of the gate window and the source and drain contact holes as illustrated in step 7. By forming the thicker oxide recessed regions as shown in step 6, compensation is provided for the fact that the oxide regions over the source and drain regions contain phosphorous atoms which produces faster etching in these oxide regions.

In step 7, photolithographic masking and etching operations are used to etch out a gate window 28, source 30 and drain 32 contact hole regions. The etchant is a is a 7:1 buffered HF acid solution. The gate window 28 and source 30 and drain 32 contact holes for the source 22 and drain 24 regions, respectively, will open up simultaneously in approximately 5 minutes and 15 seconds. The resulting structure after etching is shown in step 7. For clarity in illustration, step 7 and the remaining steps in the process do not show the recessed oxide region that is formed in step 6 in the N+ diffused regions.

In step 8, a thin oxide of approximately 500 A. thickness, which may or may not include a thin layer of phosphosilicate glass deposited on the oxide layer for stability purposes, is grown, deposited for formed on the exposed silicon surface by thermal oxide techniques. In the case where a thin phosphosilicate glass layer is desired over the thin, thermally grown gate oxide region, a suitable deposition process is carried out using a phosphorous source to form a phosphosilicate glass. Such a technique is performed using either phosphorous ($P_2O_5$) powder or a $POCl_3$ source and is well-known in the art. Thin oxide layer 34 formed in the gate window serves as the insulated gate region.

In step 9, holes are opened up through the thin oxide layer over the source 22 and drain 24 regions to expose these different regions and thereby permit electrical metal contacts to be made thereto. The structure is now ready for a metal deposition and etching operation to form both gate electrode and metal contacts to the source 22 and drain 24 regions.

In step 10, gate electrode 36, and source 38, and drain 40 electrodes are formed by depositing aluminum, for example, on the oxide layer 26 and then etching away to form the desired metal pattern. In this manner, ohmic contact is provided to the source 22 and drain 24 regions and the gate electrode 36 is provided over the thin 500 A. oxide layer that is located over the channel or gate region between the source and drain regions of the N-channel FET device shown in step 10. At this point, the $X_j$ of the N+ diffused regions is approximately 1.5 microns, the sheet resistivity of the source and drain regions are approximately 6 ohms per square, and the minimum distance or separation between source and drain regions (L effective) is about 0.2 mil. The gate electrode 36 has a surface metal portion which overlaps the thin oxide layer 34. This is important in order to prevent possible contact between the thin oxide layer 34 and a subsequently deposited (not shown) encapsulating glass or quartz layer as an encapsulant over the metallized land or pattern substrate surface. The encapsulated quartz layer is deposited preferably by RF sputtering techniques and electrical contact to the metallized regions of the FET devices in the epitaxial layer 12 is achieved by forming terminal holes and providing terminal contacts therein as shown and described in U.S. Pat. 3,408,207 to Agusta, et al. Contact between the encapsulated quartz layer and the thin oxide layer is avoided by the overlapping gate electrode for general misalignment conditions and thus, the encapsulating quartz layer, which usually has some electrical charge, will not affect the charge sensitive thin oxide gate regions.

The aluminum metal deposited on the oxide layer 26 surface for forming the conductive metal land pattern preferably has a thickness of about 15,000 A. The metal is deposited using an RF coupled metal evaporation source to prevent heating more than the source material and the high purity container (such as boron nitride) that is RF heated with eddy currents by an external RF generator. The RF coupled metal evaporation technique thus has the significant advantage in minimizing contamination of the deposited metal material because it prevents outgassing or diffusion of contaminants from other heated regions which occurs in conventional resistance heating evaporation apparatus. Elimination of contaminants in the evaporation process prevents other elements from being deposited with the aluminum which would increase the electrical charge of the deposited metal. It is essential that the deposited metal layer for FET device contact and interconnections have the lowest possible electrical charge and thus not create a significant, undesired voltage on the thin oxide or gate regions. Hence, by using an RF coupled metal evaporation source, a large amount of aluminum, or any other desired metal, can be deposited and the deposited metal contains a very low electrical potential of about 0.7 volt which is close to the low theoretical charge limit that high purity aluminum displays.

The encapsulating RF sputtered quartz layer preferably has a thickness of about 2 microns and, like the above described aluminum deposition operation, is deposited using the highest purity quartz target material and the cleanest RF system that can be obtained to prevent undesired contaminants from being deposited with the sputtered quartz on the substrate surface. Contaminants in the deposited quartz material can eventually affect device stability and can also cause an undesired increase in the electrical charge of the deposited quartz layer which might provide immediate undesired electrical effects that could seriously impair device and circuit stability.

While the above described process has been limited to a discussion of the fabrication of an insulated gate N-channel FET device, it should be readily apparent to those skilled in the semiconductor art that other types of unipolar devices can be made using the teachings of this invention. For example, P-channel FET devices as well as non-insulated gate devices can be fabricated in accordance with the principles of this invention.

The N-channel FET device shown in step 10 is turned on by applying a potential of, for example, +2 volts to the gate electrode 36, 0 or ground potential to the source electrode 38, +5 volts to the drain electrode 40, and a substrate bias potential to the P− substrate 12 of −6 volts.

Figure 2:
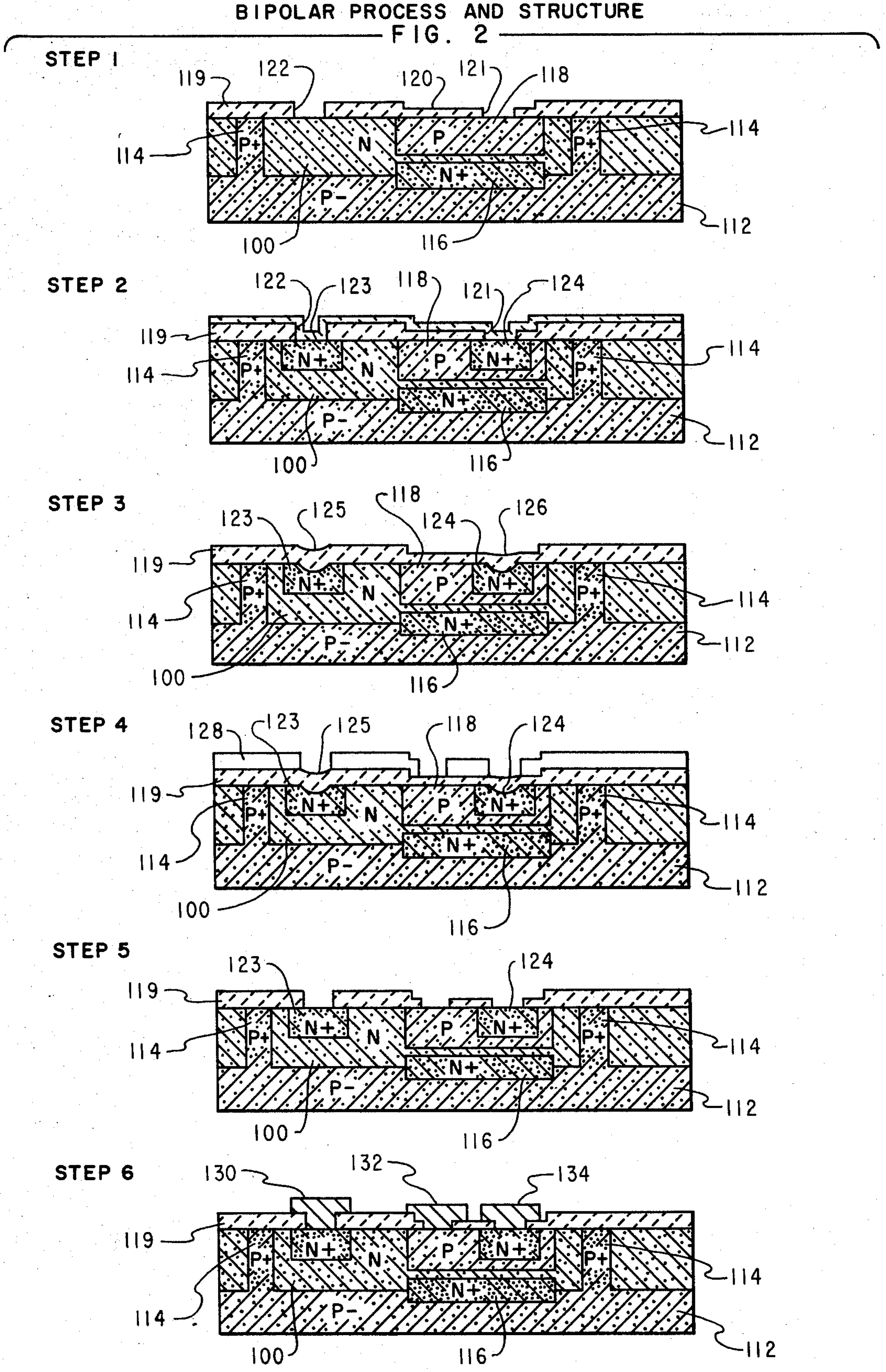
FIG. 2 is a flow diagram, in cross-section, depicting the final steps in the process for fabricating an NPN transistor device in accordance with this invention.

Referring to FIG. 2, steps 1 to 6 depict some of the final sequence of operations in forming a bipolar device such as, for example, an NPN transistor wherein the contact holes to the emitter, base and collector regions of the device are simultaneously formed without under or over-etching of any contact hole. While the conventional practice is to attempt to provide simultaneous etching of the emitter, base and collector contact holes during one etching operation, this does not occur as a practical matter in the prior art process of forming a bipolar device since the oxide areas that are to be etched away to provide the three ohmic contacts to the prior art transistor device do not have an optimum surface oxide glass layer formed thereon to permit true simultaneous etching of all three contact holes. In bipolar structures, as well as in FET structures, doped oxide regions such as phosphorous doped oxide regions over diffused N-type regions etch much quicker than undoped or substantially undoped oxide regions. Consequently, subsequent to an emitter diffusion operation using a phosphorous source which causes the formation of a phosphorous doped oxide layer over the emitter region, etching out of a contact hole through the rich, phosphorous doped oxide region to make contact to the diffused emitter region is a much quicker etching operation than the etching time it takes to etch through other oxide regions of the transistor device to make contact to the base or other P-type regions. The following description of the steps illustrated in FIG. 2 describes the optimum formation of an oxide insulator layer on a transistor device in such a manner that true and actual simultaneous etching of the emitter, base and collector contact holes is achieved.

Referring to step 1, a semiconductor structure is shown subsequent to the epitaxial growth formation of an N-type layer 100 on a P-type substrate 112. Isolation diffused region 114 surrounds the N-type epitaxial region 100. N+ region 116 serves as the subcollector region of the transistor device that is to be formed. Base region 118 is a diffused P-type region located within the N-type epitaxial layer 100. A thermal oxide surface layer 119 of about 5,000 A. for example, is located on the most of the semiconductor substrate surface as depicted in step 1; however, a reduced oxide region or layer 120 of about 3,500 A. is shown over the P-type diffused base region 118. In order to illustrate the significant process of this invention, the prior steps used in fabricating a transistor structure to this point are not depicted since they are conventional and are illustrated, for example, in the U.S. Pat. 3,508,207 to Benjamin Agusta, et al. An emitter opening 121 is shown in the reduced oxide region 120 in order to permit the subsequent diffusion of an emitter region within the base region 118. An opening 122 is also provided in the thicker oxide layer 119 for the purpose of permitting a diffused collector contact region to be formed. These openings are formed using conventional photolithographic masking and etching techniques.

Step 2 depicts the next operation of process step in the fabrication of an NPN transistor device in accordance with the principles of this invention. A phosphosilicate glass layer, labeled PSG of about 1300 A. is deposited on the oxide layer 119, oxide region 120 and in contact with the silicon in the openings 121 and 122 in the oxide surface layer. Step 2 also depicts the partial formation of an N+ diffused collector contact region 123 located beneath the opening 122 in the oxide layer 119. Similarly, partial diffused region 124 is an emitter region that is also formed during the deposition of the PSG glass (at 900° C., for example).

Step 3 depicts the transistor structure after a reoxidation step which causes further drive-in of the diffused collector contact 123 and emitter 124 regions of the transistor device. The reoxidation step is carried out for a time and at a temperature (similar to the operation described above with reference to the reoxidation operation in the formation of the source and drain regions) sufficient to create recesses 125 and 126 over the diffused collector contact 123 and emitter region 124, respectively. As described above with reference to the FET process, an oxide region is also formed in the diffused N+ regions 123 and 124. The oxide recessed regions have a thickness of about 7,500 A. which is substantially higher than the thickness of the oxide layer 119 (about 6,500 A.) and much thicker than the approximately 4,500 A. thick oxide region 120 surrounding the emitter oxide recess region 126. These thicker oxide recessed regions 125 and 126 are formed above the diffused collector contact and emitter regions 123 and 124, respectively, because of the extended reoxidation operation that is carried out which causes very rapid oxide growth over and into the highly doped N+ diffused regions. The oxide regions above these diffused N+ regions will grow substantially thicker than the other oxide regions located on the semiconductor substrate.

Step 4 depicts the transistor structure of step 3 after a photoresist layer 128 has been deposited and photolithographically developed in a manner to form openings in the photoresist layer 128. These openings permit the formation of emitter, base and collector contact holes in the underlying oxide layer by an etching operation carried out through the openings in the photoresist layer 128. As can be seen in this step, the emitter and collector (contact hole) oxide regions are shown to be much thicker than the base contact region and during a subsequent etching operation the simultaneous formation of contact openings to the emitter, base and collector regions is achieved because of the simultaneous opening of these contact holes due to the thickness optimization of the various oxide regions formed during the reoxidation step of the process with consideration being taken into account of the doping concentration in these regions.

Step 5 depicts the structure of step 4 with the openings shown in the oxide layer for providing contact to the emitter 124, base 118 and collector 123 contact regions of the NPN transistor device.

Step 6 depicts the completed NPN transistor device with metal contact 130 shown in electrical ohmic contact to the diffused collector contact region 123, metal ohmic contact 132 to the diffused base region 118, and metal ohmic contact 134 to the diffused emitter region 124.

In carrying out the practice of this invention an NPN transistor device is made with a phosphorous glass layer used in the formation of the emitter region. It should be evident to those skilled in the art and it is intended that the claims defined below cover the formation of other types of semiconductor structures, i.e., PNP transistors, NP diodes, PN diodes, NPNP and PNPN devices, etc. which can be made in accordance with the practices of this invention. Similarly, other diffusion sources than phosphorous can be used and variations can be made in the disclosed reoxidation etching operation to achieve simultaneous openings in the oxide layer over different or opposite regions of conductivity which can be utilized in accordance with the teaching of this invention.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. In a process for fabricating a semi-conductor device having an insulating, passivating thermal oxide layer comprising a phosphosilicate glass layer and having semiconductor regions of opposite type conductivity comprising the steps of:

optimizing by oxidation the thickness of different regions of said phosphosilicate glass layer located on a surface of said device wherein said optimised phosphosilicate glass layer is formed thicker over certain semiconductor regions than over other semiconductor regions, and simultaneously etching openings completely through regions of said phosphosilicate glass layer located over said semiconductor regions of opposite type conductivity.

2. The process of claim 1 wherein said optimized phosphosilicate glass layer is formed thicker over certain semiconductor regions of one conductivity type than over other semiconductor regions of the opposite conductivity type.

3. The process of claim 2 wherein said optimized phosphosilicate glass layer is formed thicker over at least one N+ semiconductor region than over P-type semiconductor regions.

4. The process of claim 3 including the step of forming said N+ region by diffusion.

5. In a process for fabricating an FET semiconductor device having an insulating, passivating thermal oxide layer comprising a phosphosilicate glass layer and having a gate region and source and drain regions of one conductivity type located in a substrate of the opposite type conductivity comprising the steps of:

optimizing by oxidation the thickness of different regions of said phosphosilicate glass layer located on a surface of said FET device, wherein said optimized phosphosilicate glass layer is formed thicker over certain semiconductor regions than over other semiconductor regions, and simultaneously etching openings completely through regions of said phosphosilicate glass layer located over said gate region and said source and drain regions of said FET device.

6. In a process for fabricating an FET semiconductor device comprising the steps of:

forming a substrate of one conductivity type;

diffusing source and drain regions of the opposite conductivity type into said substrate through an oxide layer mask located on said substrate;

reoxidizing the substrate surface at a temperature, in an atmosphere, and for a period of time sufficient to develop optimum differential regions of a phosphosilicate glass layer, wherein said optimized phosphosilicate glass layer is formed thicker over certain semiconductor regions than over other semiconductor regions, and simultaneously etching gate window, source and drain openings completely through regions of said phosphosilicate glass layer.

7. The process of claim 6 wherein said substrate is of P-type silicon and said source and drain regions are of N-type conductivity.

8. The process of claim 6 wherein said substrate is of N-type silicon and said source and drain regions are of P-type conductivity.

9. The process of claim 7 wherein said diffusion step is carried out with a phosphorous source.

10. The process of claim 9 wherein said phosphorous source is deposited at a temperature of about 900° C., said reoxidation step is carried out for a time period of 10 minutes in dry oxygen, 120 minutes in a steam oxidation atmosphere, and 5 minutes in dry oxygen.

11. In a process for fabricating a bipolar semiconductor transistor device comprising the steps of:

forming a collector substrate of one conductivity type;

diffusing base and emitter regions into said substrate through an oxide layer mask located on said substrate;

reoxidizing the substrate surface at a temperature, in an atmosphere, and for a period of time sufficient to grow optimum differential oxide regions across the oxide layer, and, simultaneously etching openings completely through said optimum differential oxide regions of said oxide layer to expose surface portions of said emitter, base and collector regions.

12. The process of claim 11 wherein said device is an NPN transistor.

13. The process of claim 11 wherein said device is a PNP transistor.

14. In a process for fabricating a bipolar semiconductor transistor device having emitter, base and collector regions and having an insulating, passivating thermal oxide layer comprising a phosphosilicate glass layer comprising the steps of:

optimizing by oxidation the thickness of different regions of said phosphosilicate glass layer located on a surface of said transistor device, wherein said optimized phosphosilicate glass layer is formed thicker over certain semiconductor regions than other semiconductor regions, and, simultaneously etching openings completely through regions of said phosphosilicate glass layer located over said emitter, base and collector regions of said transistor device.

15. The process of claim 14 wherein said transistor device is made of silicon.

16. The process of claim 14 wherein said optimized phosphosilicate glass layer is formed thicker over said emitter region than over the base region of said transistor device.

17. The process of claim 16 wherein said emitter region is of N-type conductivity.

18. The process of claim 16 wherein said emitter region is of P-type conductivity.

References Cited

UNITED STATES PATENTS

| | | | |
|---|---|---|---|
| 3,457,125 | 7/1969 | Kerr | 29—571 |
| 3,461,361 | 8/1969 | De Livorias | 29—571 |
| 3,566,457 | 3/1971 | Engeler | 29—571 |
| 3,566,517 | 3/1971 | Brown et al. | 29—571 |
| 3,476,619 | 11/1969 | Tolliver | 29—571 X |

JACOB H. STEINBERG, Primary Examiner

U.S. Cl. X.R.

29—571, 578; 148—187; 317—235